United States Patent
Lin

(10) Patent No.: US 10,383,245 B1
(45) Date of Patent: Aug. 13, 2019

(54) POWER SUPPLY CHASSIS HAVING GUIDING AND FIXING EFFECT

(71) Applicant: CHYNG HONG ELECTRONIC CO., LTD., Taichung (TW)

(72) Inventor: Mu-Chun Lin, Taichung (TW)

(73) Assignee: CHYNG HONG ELECTRONIC CO., LTD., Taichung (TW)

( * ) Notice: Subject to any disclaimer, the term of this patent is extended or adjusted under 35 U.S.C. 154(b) by 0 days.

(21) Appl. No.: 16/054,006

(22) Filed: Aug. 3, 2018

(51) Int. Cl.
  *H05K 7/14* (2006.01)
  *G06F 1/18* (2006.01)
  *H05K 5/02* (2006.01)

(52) U.S. Cl.
  CPC ........... *H05K 7/1432* (2013.01); *G06F 1/188* (2013.01); *H05K 5/0217* (2013.01); *H05K 5/0247* (2013.01); *H05K 7/1457* (2013.01)

(58) Field of Classification Search
  CPC .. H05K 7/1432; H05K 7/1489; H05K 7/1457; H05K 5/0217; H05K 5/0247; G06F 1/188
  USPC ..................... 361/679.01, 724–727
  See application file for complete search history.

(56) References Cited

U.S. PATENT DOCUMENTS

| 5,594,627 | A * | 1/1997 | Le | H05K 7/1405 361/752 |
| 8,971,036 | B1 * | 3/2015 | Lau | G06F 1/20 361/679.34 |
| 2003/0058613 | A1 * | 3/2003 | Varghese | G06F 1/18 361/679.01 |
| 2010/0264792 | A1 * | 10/2010 | Chang | H05K 7/1489 312/294 |
| 2012/0068031 | A1 * | 3/2012 | Phelan | H05K 7/1489 248/224.8 |
| 2016/0150668 | A1 * | 5/2016 | Cheng | H05K 7/1489 361/679.02 |

\* cited by examiner

*Primary Examiner* — Steven T Sawyer
*Assistant Examiner* — Sagar Shrestha
(74) *Attorney, Agent, or Firm* — Sinorica, LLC

(57) ABSTRACT

A power supply chassis has at least one accommodating slot therein. Two side walls of the accommodating slot of the power supply chassis are provided with a first left guiding and fixing block and a first right guiding and fixing block. The guiding and fixing blocks have a first left guiding bevel and a first right guiding bevel facing a front side of the accommodating slot, a first left fixing plane and a first right fixing plane corresponding in position to the middle of the accommodating slot. When a power supply is placed into the accommodating slot, the first left guiding bevel and the first right guiding bevel guide the power supply to a middle position of the accommodating slot, and the power supply is clamped by the first left fixing plane and the first right fixing plane to enhance the stability of the power supply.

2 Claims, 5 Drawing Sheets

POWER SUPPLY CHASSIS HAVING GUIDING AND FIXING EFFECT

FIELD OF THE INVENTION

The present invention relates to a power supply chassis, and more particularly to a power supply chassis having a guiding and fixing effect.

BACKGROUND OF THE INVENTION

In the prior art, for a power supply to be placed into a chassis, the power supply is first placed into an accommodating slot of the chassis, and L-shaped type fixing plates are connected to two side walls of the rear of the power supply. The other ends of the L-shaped fixing plates are located at a rear position of the chassis and extend toward both sides of the chassis. The other ends of the L-shaped fixing plates are locked to the rear side of the chassis, so that the power supply can be fixed in the chassis and won't shake left and right.

However, since the L-shaped fixing plates of the power supply are locked to the rear side of the chassis from the rear, it is very inconvenient in operation. The front side of the power supply is not fixed. During the process of moving the chassis, the front side of the power supply is unstable and easy to shake and even hits the side walls of the chassis to cause damage. Accordingly, the inventor of the present invention has devoted himself based on his many years of practical experiences to solve these problems.

SUMMARY OF THE INVENTION

The primary object of the present invention is to provide a power supply chassis having a guiding and fixing effect, enabling a power supply to be stably seated in an accommodating slot of the power supply chassis.

In order to achieve the aforesaid object, a power supply chassis is provided. The power supply chassis has at least one accommodating slot therein. The accommodating slot is configured to accommodate a power supply therein. Two sides of the power supply have a left side plate and a right side plate, respectively. A first left guiding and fixing block is disposed on a left side wall of the accommodating slot. The first left guiding and fixing block has a first left guiding bevel facing a front side of the accommodating slot. The first left guiding bevel extends toward the front side of the accommodating slot. The first left guiding bevel is inclined from right to left. A first right guiding and fixing block is disposed on a right side wall of the accommodating slot and corresponds to the first left guiding and fixing block. The first right guiding and fixing block has a first right guiding bevel facing the front side of the accommodating slot. The first right guiding bevel extends toward the front side of the accommodating slot. The first right guiding bevel is inclined from left to right.

When the power supply is placed into the accommodating slot of the power supply chassis, the first left guiding bevel and the first right guiding bevel guide the power supply to a middle position of the accommodating slot, so that the power supply does not move left and right in the accommodating slot to enhance the stability of the power supply in the accommodating slot.

DETAILED DESCRIPTION OF THE PREFERRED EMBODIMENTS

Embodiments of the present invention will now be described, by way of example only, with reference to the accompanying drawings.

Figure 1:
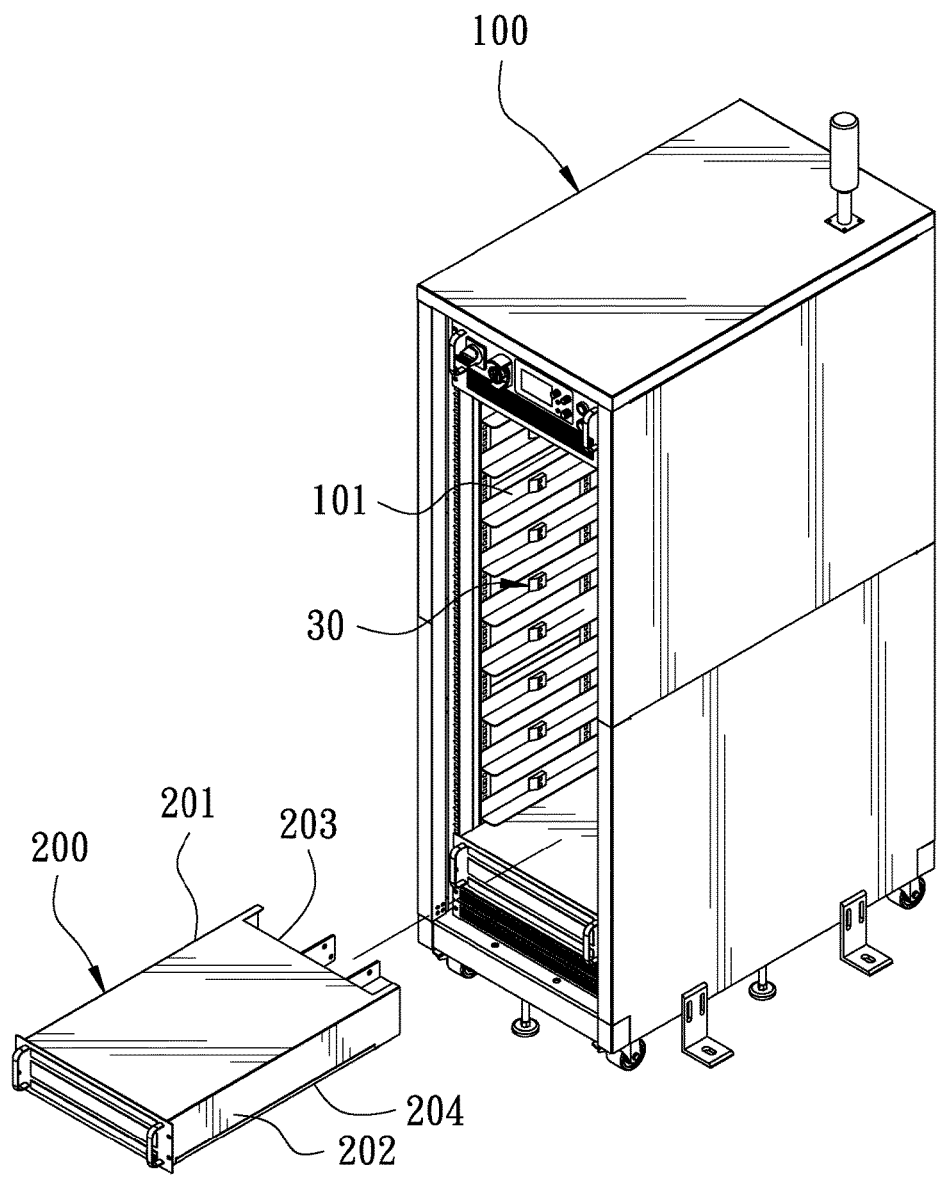
FIG. 1 is a perspective view of the power supply chassis in accordance with a preferred embodiment of the present invention, showing that the power supply chassis is not yet equipped with the power supply.

FIG. 1 is a perspective view of a power supply chassis in accordance with a preferred embodiment of the present invention. The present invention discloses a power supply chassis 100 having a guiding and fixing effect. The power supply chassis 100 has a plurality of accommodating slots 101 therein. Each accommodating slot 101 is configured to accommodate a power supply 200 therein. Two sides of the power supply 200 have a left side plate 201 and a right side plate 202, respectively. The rear of the power supply 200 has a back plate 203 in a longitudinal direction. The bottom of the power supply 200 has a bottom plate 204 in a horizontal direction. The power supply chassis 100 includes a first left guiding and fixing block 10, a first right guiding and fixing block 20, a second left guiding and fixing block 30, and a second right guiding and fixing block 40.

Figure 2:
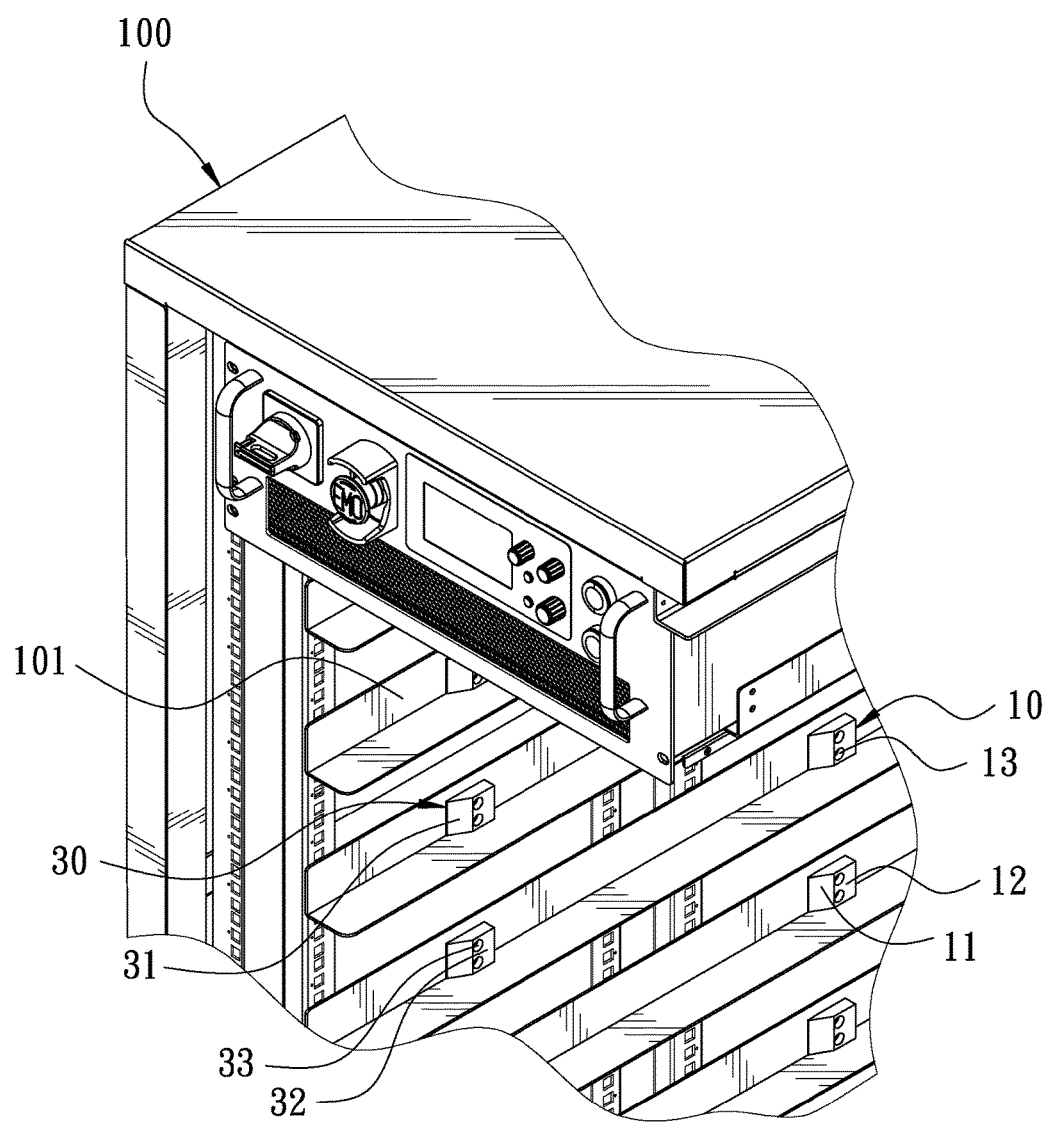
FIG. 2 is a partial enlarged view of the preferred embodiment of the present invention, showing that the first left guiding and fixing block and the second left guiding and fixing block are mounted to the accommodating slot.

The first left guiding and fixing block 10, referring to FIG. 2, is disposed on a left side wall of the accommodating slot 101 and located at a rear position of the accommodating slot 101. The first left guiding and fixing block 10 is made of engineering plastics having an insulating function. The first left guiding and fixing block 10 has a first left guiding bevel 11 facing a front side of the accommodating slot 101. The first left guiding bevel 11 extends toward the front side of the accommodating slot 101. The first left guiding bevel 11 is inclined from right to left. The first left guiding and fixing block 10 has a first left fixing plane 12 corresponding to a middle position of the accommodating slot 101. The first left fixing plane 12 is provided with two screw holes 13 for fixing the first left guiding and fixing block 10 to the left side wall of the accommodating slot 101 by means of screws. When the power supply 200 is disposed in the accommodating slot 101, the first left fixing plane 12 is located at a position where the back plate 203 and the bottom plate 204 of the power supply 200 are connected to each other.

Figure 3:
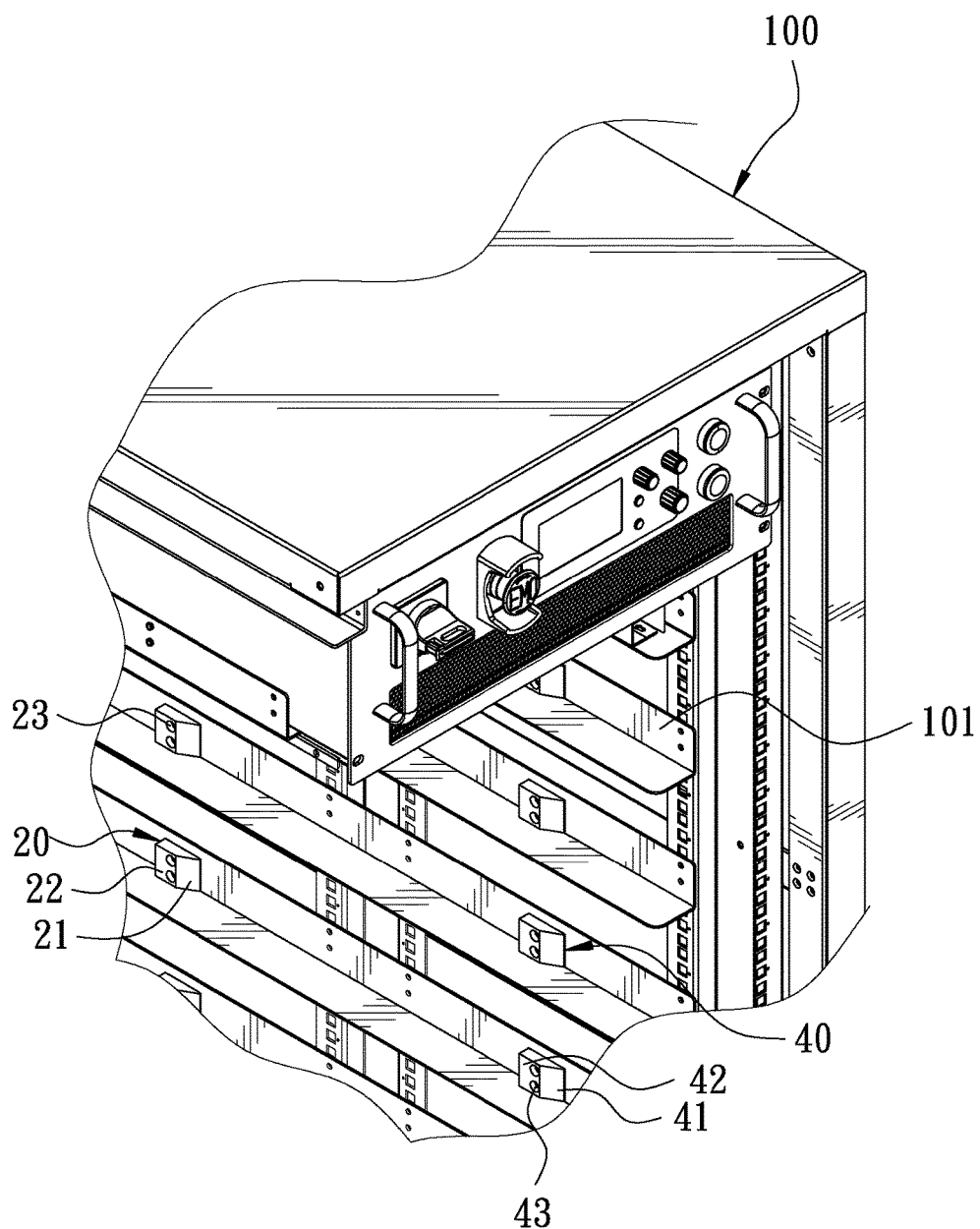
FIG. 3 is a partial enlarged view of the preferred embodiment of the present invention, showing that the first right guiding and fixing block and the second right guiding and fixing block are mounted to the accommodating slot.

The first right guiding and fixing block 20, referring to FIG. 3, is disposed on a right side wall of the accommodating slot 101 and corresponds to the first left guiding and fixing block 10. The first right guiding and fixing block 20 is made of engineering plastics having an insulating function. The first right guiding and fixing block 20 has a first right guiding bevel 21 facing the front side of the accommodating slot 101. The first right guiding bevel 21 extends toward the front side of the accommodating slot 101. The first right guiding bevel 21 is inclined from left to right. The first right guiding and fixing block 20 has a first right fixing plane 22 corresponding to the first left fixing plane 12. The first right fixing plane 22 is provided with two screw holes 23 for fixing the first right guiding and fixing block 20 to the right side wall of the accommodating slot 101 by means of screws. When the power supply 200 is disposed in the accommodating slot 101, the first right fixing plane 22 is located at a position where the back plate 203 and the bottom plate 204 of the power supply 200 are connected to each other.

The second left guiding and fixing block 30 is disposed on the left side wall of the accommodating slot 101 and located at a front position of the accommodating slot 101. The second left guiding and fixing block 30 is made of rubber having an insulating function. The second left guiding and fixing block 30 has a second left guiding bevel 31 facing the front side of the accommodating slot 101. The second left guiding bevel 31 extends toward the front side of the accommodating slot 101. The second left guiding bevel 31 is inclined from right to left. The second left guiding and fixing block 30 has a second left fixing plane 32 corresponding to the middle position of the accommodating slot 101. The second left fixing plane 32 is provided with two screw holes 33 for fixing the second left guiding and fixing block 30 to the left side wall of the accommodating slot 101 by means of screws. When the power supply 200 is disposed in the accommodating slot 101, the second left fixing plane 32 is located at a position corresponding to the bottom plate 204 of the power supply 200.

The second right guiding and fixing block 40 is disposed on the right side wall of the accommodating slot 101 and corresponds to the second left guiding and fixing block 30. The second right guiding and fixing block 40 is made of rubber having an insulating function. The second right guiding and fixing block 40 has a second right guiding bevel 41 facing the front side of the accommodating slot 101. The second right guiding bevel 41 extends toward the front side of the accommodating slot 101. The second right guiding bevel 41 is inclined from left to right. The second right guiding and fixing block 40 has a second right fixing plane 42 corresponding to the second left fixing plane 32. The second right fixing plane 42 is provided with two screw holes 43 for fixing the second right guiding and fixing block 40 to the right side wall of the accommodating slot 101 by means of screws. When the power supply 200 is disposed in the accommodating slot 101, the second right fixing plane 42 is located at a position corresponding to the bottom plate 204 of the power supply 200.

Figure 4:
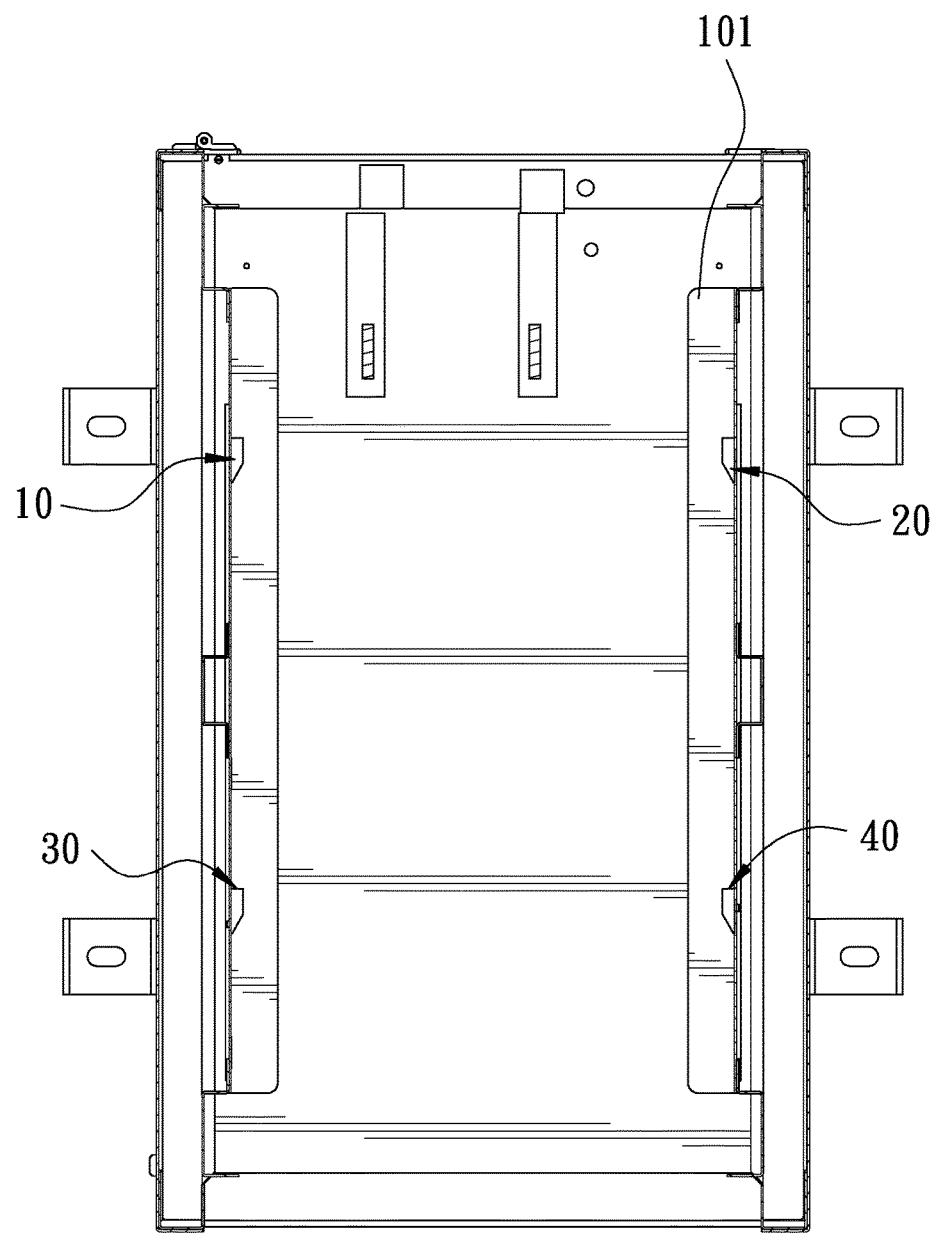
FIG. 4 is a cross-sectional view of the preferred embodiment of the present invention, showing that the power supply has not been installed in the accommodating slot.
Figure 5:
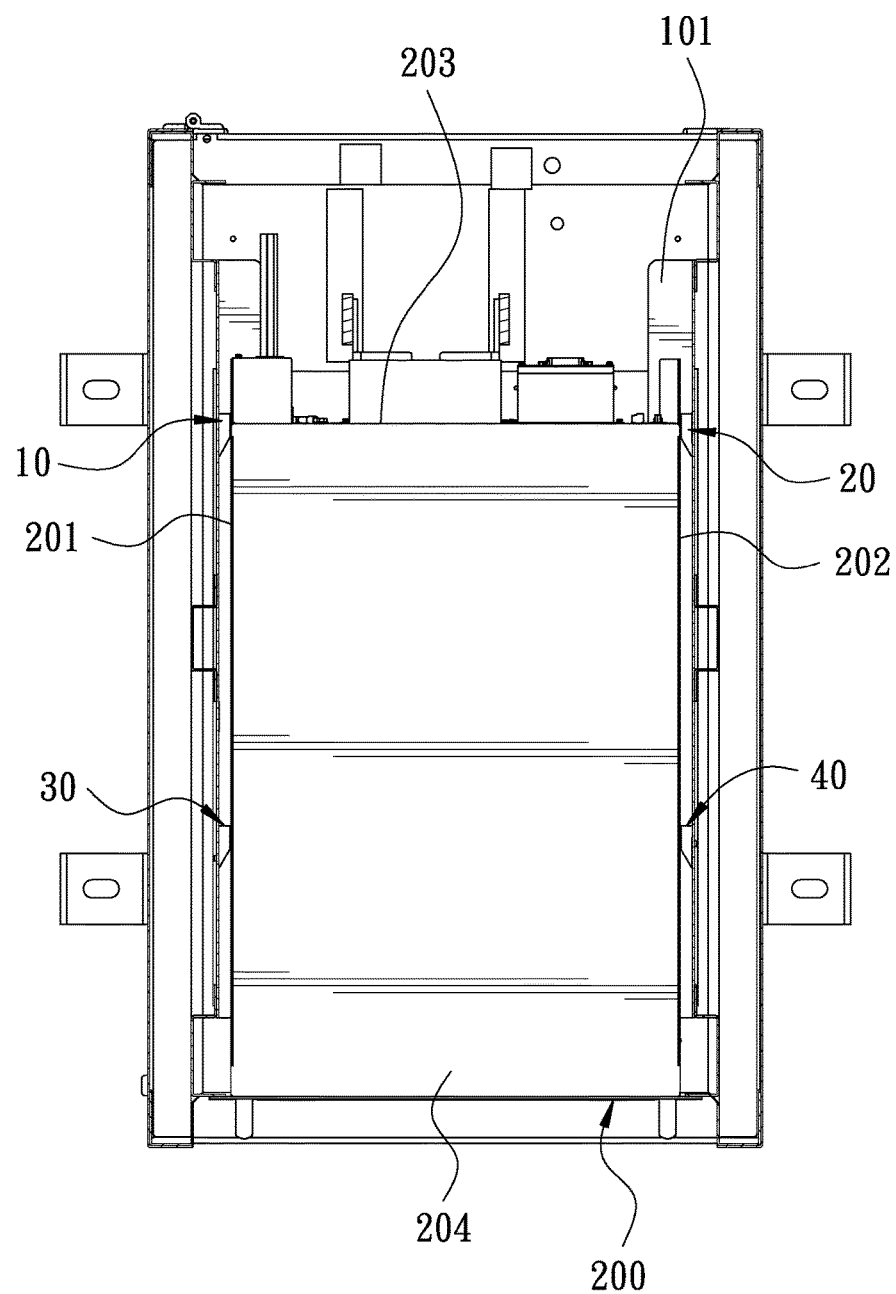
FIG. 5 is a schematic view showing the use of the preferred embodiment of the present invention, showing that the power supply is disposed in the accommodating slot.

Please refer to FIG. 4 and FIG. 5 again. First, when the power supply 200 is placed into the accommodating slot 101 of the power supply chassis 100, the user only needs to push the power supply 200 toward the accommodating slot 101. The corners of the back plate 203 of the power supply 200 are moved along the second left guiding bevel 31 and the second right guiding bevel 41 in the front position of the accommodating slot 101, and the power supply 200 is guided to the middle position of the accommodating slot 101. The left side plate 201 and the right side plate 202 at both sides of the power supply 200 abut against the second left fixing plane 32 and the second right fixing plane 42, and the second left fixing plane 32 and the second right fixing plane 42 are located a position corresponding to the bottom plate 204. Then, the power supply 200 is continuously pushed into the accommodating slot 101. The corners of the back plate 203 of the power supply 200 are moved along the first left guiding bevel 11 and the first right guiding bevel 21 in the rear position of the accommodating slot 101, and the power supply 200 is guided to the middle position of the accommodating slot 101. The left side plate 201 and the right side plate 202 at both sides of the power supply 200 abut against the first left fixing plane 12 and the first right fixing plane 22, and the first left fixing plane 12 and the first right fixing plane 22 are located a position where the back plate 203 and the bottom plate 204 of the power supply 200 are connected to each other. Therefore, the left side plate 201 and the right side plate 202 at both sides of the power supply 200 are clamped by the first left fixing plane 12, the first right fixing plane 22, the second left fixing plane 32 and the second right fixing plane 42 by a simple structure, so that the power supply 200 does not move left and right in the accommodating slot 101 to enhance the stability of the power supply 200 in the accommodating slot 101.

It is to be noted that the back plate 203 and the bottom plate 204 are supported by the abutting function between the left side plate 201 and the right side plate 202 respectively, so that the back plate 203 can abut against the first left fixing plane 12 and the first right fixing plane 22 to clamp the power supply 200. Besides, the bottom plate 204 is supported by the abutting function between the left side plate 201 and the right side plate 202 respectively, so that the bottom plate 204 can abut against the second left fixing plane 32 and the second right fixing plane 42 to clamp the power supply 200. The damage of the power supply 200 caused by the sway of the power supply chassis 100 can be avoided, and the stability of the power supply 200 in the accommodating slot 101 is further enhanced.

It is worth mentioning that the second left guiding and fixing block 30 and the second right guiding and fixing block 40 in the front position of the accommodating slot 101 are made of a rubber material; the first left guiding and fixing block 10 and the first right guiding and position block 20 in the rear position of the accommodating slot 101 are made of an engineering plastic material. The rubber material is soft and elastic, and the engineering plastic material is relatively hard. Therefore, when the power supply 200 is placed into the accommodating slot 101, because the second left guiding and fixing block 30 and the second right guiding and fixing block 40 are softer in material and less resistant, the power supply 200 can be easily pushed into the accommodating slot 101. The material of the first left guiding and fixing block 10 and the first right guiding and fixing block 20 is relatively hard. Therefore, after the power supply 200 is positioned in the accommodating slot 101, the power supply 200 can be held by the first left guiding and fixing block 10 and the first right guiding and fixing block 20, so that the power supply 200 can be stably disposed in the accommodating slot 101 to improve convenience and stability.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A power supply chassis system comprising:
a left side wall;
a right side wall;
a front side;
an accommodating slot;
a first left guiding and fixing block;
a first right guiding and fixing block;
a power supply;
the accommodating slot being formed in between the front side, the left side wall and the right side wall;

the accommodating slot being configured to accommodate the power supply;

the first left guiding and fixing block being disposed on the left side wall;

the first left guiding and fixing block comprising a first left guiding bevel and a first left fixing plane;

the first left guiding bevel facing the front side;

the first left guiding bevel extending toward the front side;

the first left guiding bevel being inclined from the right side wall to the left side wall;

the first right guiding and fixing block being disposed on the right side wall;

the first right guiding and fixing block corresponding to the first left guiding and fixing block;

the first right guiding and fixing block comprising a first right guiding bevel and a first right fixing plane;

the first right guiding bevel facing the front side;

the first right guiding bevel extending toward the front side;

the first right guiding bevel being inclined from the left side wall to the right side wall;

the accommodating slot comprising a rear portion and a middle portion;

the first left guiding and fixing block being located at the rear portion;

the first right guiding and fixing block being located at the rear portion;

in response to the power supply being moved into the accommodating slot, the first left guiding bevel and the first right guiding bevel guiding the power supply to the middle portion;

the power supply comprising a left side plate, a right side plate, a back plate and a bottom plate;

the back plate and the bottom plate being connected to each other;

the first left fixing plane being configured to abut against the left side plate, the back plate and the bottom plate;

the first right fixing plane being configured to abut against the right side plate, the back plate and the bottom plate; and in response to the power supply being accommodated within the accommodating slot, the first left fixing plane abutting against the left side plate, the back plate and the bottom plate and the first right fixing plane abutting against the right side plate, the back plate and the bottom plate so as to enhance stability of the power supply in the accommodating slot by preventing the power supply from moving left and right in the accommodating slot.

2. The power supply chassis system as claimed in claim 1 comprising a second left guiding and fixing block and a second right guiding and fixing block, the accommodating slot comprising a front portion, the second left guiding and fixing block being located at the front portion, the second right guiding and fixing block being located at the front position, the second left guiding and fixing block comprising a second left fixing plane, the second right guiding and fixing block comprising a second right fixing plane, the second left fixing plane being configured to abut against the left side plate and the bottom plate, the second right fixing plane being configured to abut against the right side plate and the bottom plate, the second left fixing plane abutting against the left side plate and the bottom plate and the second right fixing plane abutting against the right side plate and the bottom plate in response to the power supply being accommodated within the accommodating slot.

\* \* \* \* \*